United States Patent
Lai et al.

(10) Patent No.: US 12,063,774 B2
(45) Date of Patent: Aug. 13, 2024

(54) FORMING CONTROL METHOD APPLIED TO RESISTIVE RANDOM-ACCESS MEMORY CELL ARRAY

(71) Applicant: eMemory Technology Inc., Hsin-Chu (TW)

(72) Inventors: Tsung-Mu Lai, Hsinchu County (TW); Meng-Chiuan Wu, Hsinchu County (TW); Wei-Chen Chang, Hsinchu County (TW); I-Lang Lin, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 260 days.

(21) Appl. No.: 17/880,811

(22) Filed: Aug. 4, 2022

(65) Prior Publication Data

US 2023/0046230 A1     Feb. 16, 2023

Related U.S. Application Data

(60) Provisional application No. 63/232,668, filed on Aug. 13, 2021.

(51) Int. Cl.
| | |
|---|---|
| G11C 11/16 | (2006.01) |
| G11C 7/24 | (2006.01) |
| G11C 13/00 | (2006.01) |
| H01L 23/525 | (2006.01) |
| H10B 20/20 | (2023.01) |

(52) U.S. Cl.
CPC ............ *H10B 20/20* (2023.02); *G11C 7/24* (2013.01); *G11C 11/1673* (2013.01); *G11C 11/1675* (2013.01); *G11C 11/1677* (2013.01); *G11C 13/003* (2013.01); *G11C 13/0038* (2013.01); *G11C 13/004* (2013.01); *G11C 13/0064* (2013.01); *H01L 23/5256* (2013.01); *G11C 2013/0045* (2013.01); *G11C 2213/79* (2013.01)

(58) Field of Classification Search
CPC ... G11C 7/24; G11C 11/1673; G11C 11/1875; G11C 11/1677; G11C 13/003; G11C 13/0038; G11C 13/004; G11C 13/0064; G11C 2013/0045; G11C 2213/79; H10B 20/20; H01L 23/045
USPC ......................................................... 365/148
See application file for complete search history.

(56) References Cited

U.S. PATENT DOCUMENTS

| | | | | |
|---|---|---|---|---|
| 2014/0301129 A1* | 10/2014 | Kawai | ................ | G11C 13/0069 365/148 |
| 2016/0196875 A1 | 7/2016 | Chang | | |

* cited by examiner

*Primary Examiner* — Huan Hoang
(74) *Attorney, Agent, or Firm* — WPAT, P.C

(57) ABSTRACT

A forming control method for a resistive random-access memory cell array is provided. While a forming action of the resistive random-access memory cell array is performed, a verification action is performed to judge whether the forming action on the resistive random-access memory cells has been successfully done. By properly changing a forming voltage or a pulse width, the forming actions on all of the resistive random-access memory cells of the resistive random-access memory cell array can be successfully done.

19 Claims, 8 Drawing Sheets

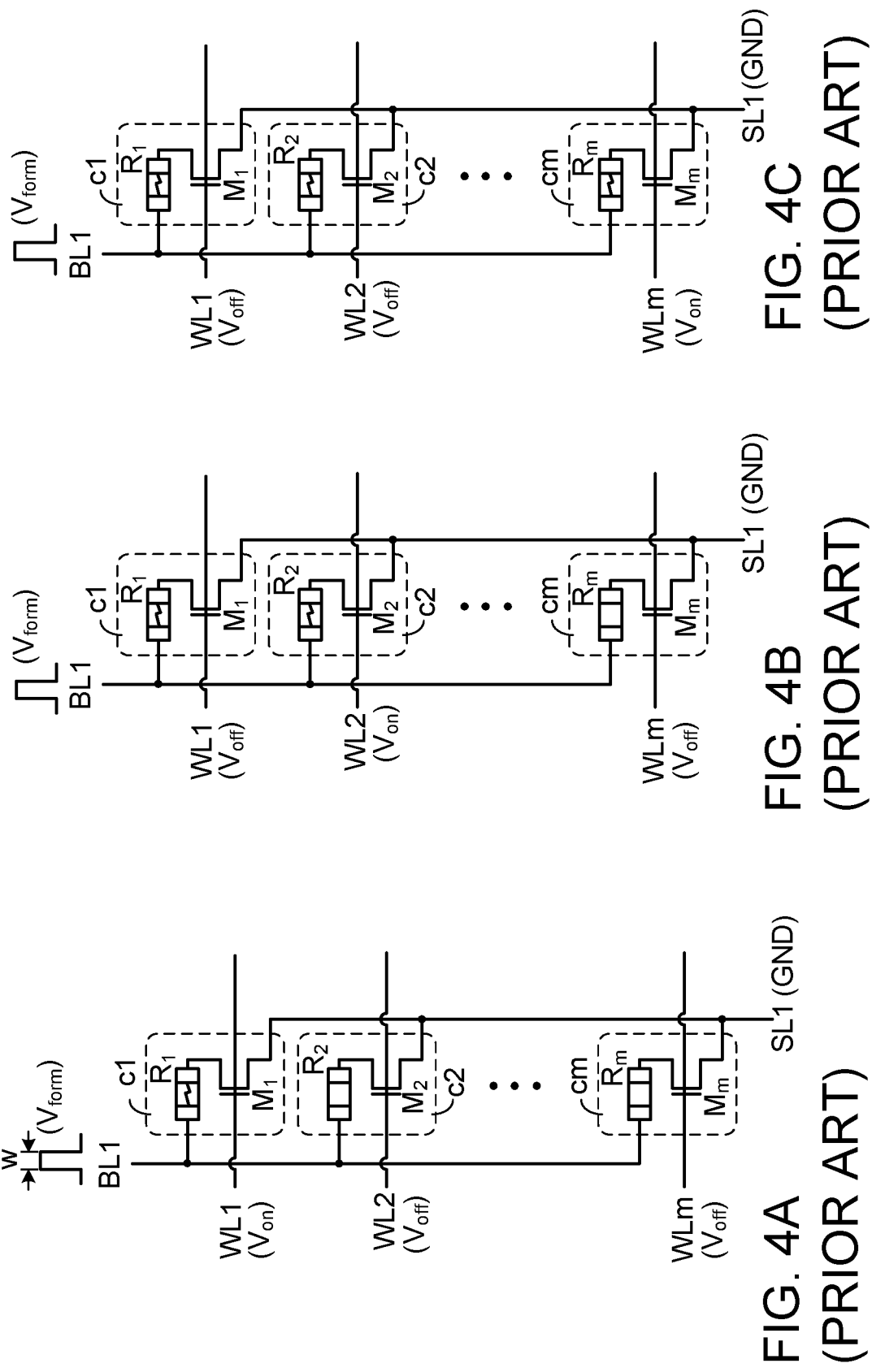

FORMING CONTROL METHOD APPLIED TO RESISTIVE RANDOM-ACCESS MEMORY CELL ARRAY

This application claims the benefit of U.S. provisional application Ser. No. 63/232,668, filed Aug. 13, 2021, the subject matter of which is incorporated herein by reference.

FIELD OF THE INVENTION

The present invention relates to a control method for a memory cell array, and more particularly to a forming control method for a resistive random-access memory cell array.

BACKGROUND OF THE INVENTION

A resistive random-access memory (ReRAM) is one kind of non-volatile memory. The resistive random-access memory comprises plural resistive random-access memory cells (ReRAM cells). Since the resistive random-access memories are manufactured with less processing steps and have faster writing speed, the resistive random-access memories are suitably used to replace the embedded flash memory in a system-on-chip (SOC).

Generally, the resistive random-access memory cell comprises a resistive element. By adjusting the resistance value of the resistive element, the storage state of the resistive random-access memory cell can be adjusted. According to storage state of the resistive random-access memory cell, the resistive random-access memory cell can be selectively in a set state corresponding to a low resistance value or a reset state corresponding to a high resistance value.

FIG. 1 schematically illustrates the structure of a conventional resistive element. As shown in FIG. 1, the resistive element 100 comprises a bottom electrode 106, an insulation layer 104 and a top electrode 102, which are arranged in a stack form. After the resistive element 100 is fabricated, the resistive element 100 is in an initial state.

Before the resistive element 100 is enabled, a forming action is performed to apply a forming voltage (e.g., 2.8V) to the region between the top electrode 102 and the bottom electrode 106. While the forming action is performed, the cluster of oxygen vacancies in the insulation layer 104 forms a conducting filament 108. In addition, the conducting filament 108 is connected with the top electrode 102 and the bottom electrode 106. Under this circumstance, the resistive element 100 is in the set state corresponding to the low resistance value.

After the resistive element 100 undergoes the forming action, plural bias voltages lower than the forming voltage are provided to the resistive element 100. Consequently, the state of the resistive element 100 can be arbitrarily switched between the set state corresponding to the low resistance value and the reset state corresponding to the high resistance value. The operations of the resistive element 100 will be described as follows.

Moreover, when the resistive element 100 is in the set state corresponding to the low resistance value, a reset action may be performed to switch the set state to the reset state corresponding to the high resistance value. While the reset action is performed, a reset voltage (e.g., about 1.7V) is applied to the region between the top electrode 102 and the bottom electrode 106. Meanwhile, the conducting filament 108 within the insulation layer 104 is subjected to a redox process. Consequently, the conducting filament 108 is almost not connected between the top electrode 102 and the bottom electrode 106. In other words, after the reset action is completed, the region between the top electrode 102 and the bottom electrode 106 has the high resistance value (i.e., in the reset state).

When the resistive element 100 is in the reset state corresponding to the high resistance value, the resistive element 100 can be switched to the set state through a set action. While the set action is performed, a set voltage (e.g., about 2.1V) is applied to the region between the top electrode 102 and the bottom electrode 106. Consequently, the conducting filament 108 within the insulation layer 104 can be well connected between the top electrode 102 and the bottom electrode 106. That is, after the set action is completed, the region between the top electrode 102 and the bottom electrode 106 has the low resistance value (i.e., in the set state).

As mentioned above, the resistive element 100 has to undergo the forming action after the resistive element 100 is fabricated. After the forming action is completed, the set action or the reset action can be performed on the resistive element 100.

While a read action is performed, a read voltage (e.g., about 0.3V~0.8V) is applied to the region between top electrode 102 and the bottom electrode 106. Moreover, the storage state of the resistive element 100 can be realized according to the magnitude of a read current generated by the resistive element 100. For example, while the read action is performed, a reference current is provided. If the read current is lower than the reference current, it is determined that the resistive element 100 is in the reset state corresponding to the high resistance value. Whereas, if the read current is higher than the reference current, it is determined that the resistive element 100 is in the set state corresponding to the low resistance value.

The read voltage can be used in a verification action. For example, after the forming action of the resistive element 100 is completed, the resistive element 100 can be subjected to a verification action to judge whether the conducting filament 108 is successfully connected between the top electrode 102 and the bottom electrode 106. That is, the verification action is performed after the forming action is completed. While the verification action is performed, the read voltage is provided to the resistive element 100. According to the read current generated by the resistive element 100, a control circuit (not shown) further judges whether the forming action is successfully done. If the magnitude of the read current is larger, the control circuit judges that the forming action of the resistive element 100 is successfully done and the verification action passes. Whereas, if the magnitude of the read current is smaller, the control circuit judges that the forming action of the resistive element 100 is unsuccessfully done and the verification action fails.

Similarly, after the set action or the reset action of the resistive element 100 is completed, the resistive element 100 can be subjected to the verification action. According to the read current generated by the resistive element 100, the control circuit further judges whether the resistive element 100 passes the verification action. For example, the verification action is performed after the reset action is performed. If the read current is smaller and the resistive element 100 is determined to be in the reset state corresponding to the high resistance value, the resistive element 100 passes the verification action and the reset action is successfully done. Whereas, if the read current is larger and the resistive element 100 is determined to be in the set state corresponding to the low resistance value, the verification action of the resistive element 100 fails and the reset action is unsuccessfully done.

FIG. 2 is a schematic equivalent circuit diagram illustrating a resistive random-access memory cell array. Moreover, plural random-access memory cells can be collaboratively formed as a resistive random-access memory cell array. As shown in FIG. 2, the resistive random-access memory cell array 200 comprises m×n resistive random-access memory cells c11~cmn, wherein m and n are positive integers. The structures of the resistive random-access memory cells c11~cmn are identical. For succinctness, only the resistive random-access memory cell c11 will be described as follows.

The resistive random-access memory cell c11 is a three-terminal device. The resistive random-access memory cell c11 comprises a resistive element $R_{11}$ and a select transistor $M_{11}$. The first terminal of the resistive element $R_{11}$ is served as a first terminal of the resistive random-access memory cell c11. The second terminal of the resistive element $R_{11}$ is connected to the first drain/source terminal of the select transistor $M_{11}$. The second drain/source terminal of the select transistor $M_{11}$ is served as a second terminal of the resistive random-access memory cell c11. The gate terminal of the select transistor $M_{11}$ is served as a control terminal of the resistive random-access memory cell c11.

Please refer to the resistive random-access memory cell array 200 again. The control terminals of the n resistive random-access memory cells c11~c1n in the first row are connected with a word line WL1. The first terminals of the n resistive random-access memory cells c11~c1n in the first row are connected with corresponding bit lines BL1~BLn, respectively. The second terminals of the n resistive random-access memory cells c11~c1n in the first row are connected with corresponding source lines SL1~SLn, respectively. The control terminals of the n resistive random-access memory cells c21~c2n in the second row are connected with a word line WL2. The first terminals of the n resistive random-access memory cells c21~c2n in the second row are connected with the corresponding bit lines BL1~BLn, respectively. The second terminals of the n resistive random-access memory cells c21~c2n in the second row are connected with the corresponding source lines SL1~SLn, respectively. The rest may be deduced by analog. Similarly, the control terminals of the n resistive random-access memory cells cm1~cmn in the m-th row are connected with a word line WLm. The first terminals of the n resistive random-access memory cells cm1~cmn in the m-th row are connected with the corresponding bit lines BL1~BLn, respectively. The second terminals of the n resistive random-access memory cells cm1~cmn in the m-th row are connected with the corresponding source lines SL1~SLn, respectively.

For example, the resistive random-access memory cell array 200 has 1024 word lines, 2048 bit lines and 2048 source lines. That is, m is equal to 1024, and n is equal to 2048.

After the resistive random-access memory cell array 200 is manufactured, it is necessary to perform the forming actions on all of the resistive random-access memory cells c11~cmn. After the control circuit judges that the forming actions on all of the resistive random-access memory cells c11~cmn have been successfully done, the resistive random-access memory cells c11~cmn can be subjected to the reset action or the set action.

A forming control method for a resistive random-access memory cell array will be illustrated as follows. For illustration, a 1×n resistive random-access memory cell array or an m×1 resistive random-access memory cell array will be described as follows. The forming control method is also applied to the m×n resistive random-access memory cell array.

FIGS. 3A, 3B and 3C are schematic circuit diagrams illustrating a conventional forming control method for the resistive random-access memory cell array. The resistive random-access memory cell array comprises 1×n resistive random-access memory cells c1~cn.

When the forming control method is performed, an on voltage $V_{on}$ is provided to the word line WL1, and a ground voltage GND (i.e., 0V) is provided to the source lines SL1~SLn. Then, a forming pulse is provided to the bit lines BL1~BLn sequentially. For example, the on voltage $V_{on}$ is equal to the 2.5V. The pulse width of the forming pulse is w, and the pulse height of the forming pulse is equal to a forming voltage $V_{form}$. For example, the pulse width w is 100 ns, and the forming voltage $V_{form}$ is 2.8V.

Firstly, a forming action is performed on the resistive random-access memory cell c1. As shown in FIG. 3A, the forming pulse is provided to the bit line BL1, and the ground voltage GND is provided to the other bit lines BL2~BLn. In the resistive random-access memory cell c1, the word line WL1 receives the on voltage $V_{on}$. Consequently, the select transistor $M_1$ is turned on, and the forming voltage $V_{form}$ is applied to the two terminals of the resistive element $R_1$. In addition, a conducting filament is formed between the two terminals of the resistive element $R_1$. In the resistive random-access memory cells c2~cn, the bit lines BL2~BLn receive the ground voltage GND. Since the two terminals of each of the resistive elements $R_2$~$R_n$ do not receive the forming voltage $V_{form}$, the conducting filament is not formed between the two terminals of each of the resistive elements $R_2$~$R_n$.

Then, a forming action is performed on the resistive random-access memory cell c2. As shown in FIG. 3B, the forming pulse is provided to the bit line BL2, and the ground voltage GND is provided to the bit lines BL1 and BL3~BLn. In the resistive random-access memory cell c2, the word line WL1 receives the on voltage $V_{on}$. Consequently, the select transistor $M_1$ is turned on, and the forming voltage $V_{form}$ is applied to the two terminals of the resistive element $R_2$. In addition, a conducting filament is formed between the two terminals of the resistive element $R_2$. In addition, the conducting filament is not formed between the two terminals of each of the resistive elements $R_3$~$R_n$ of the resistive random-access memory cells c3~cn.

The rest may be deduced by analog. The forming pulse is provided to the other bit lines sequentially. Afterwards, a forming action is performed on the resistive random-access memory cell cn. As shown in FIG. 3C, the forming pulse is provided to the bit line BLn, and the ground voltage GND is provided to the other bit lines. In the resistive random-access memory cell cn, the word line WL1 receives the on voltage $V_{on}$. Consequently, the select transistor $M_n$ is turned on, and the forming voltage $V_{form}$ is applied to the two terminals of the resistive element $R_n$. In addition, a conducting filament is formed between the two terminals of the resistive element $R_n$.

After the forming pulse is provided to the bit line BL1~BLn sequentially, the forming actions on the n resistive random-access memory cells of the 1×n resistive random-access memory cell array are performed sequentially.

FIGS. 4A, 4B and 4C are schematic circuit diagrams illustrating another conventional forming control method for the resistive random-access memory cell array. The resistive random-access memory cell array comprises m×1 resistive random-access memory cells c1~cm.

When the forming control method is performed, a ground voltage GND (i.e., 0V) is provided to the source line SL1, a forming pulse is provided to the bit line BL1, and an on voltage $V_{on}$ is provided to the word lines WL1~WLm sequentially. For example, the on voltage $V_{on}$ is equal to 2.5V. The pulse width of the forming pulse is w, and the pulse height of the forming pulse is equal to a forming voltage $V_{form}$. For example, the pulse width w is 100 ns, and the forming voltage $V_{form}$ is 2.8V.

Firstly, a forming action is performed on the resistive random-access memory cell c1. As shown in FIG. 4A, the on voltage $V_{on}$ is provided to the word line WL1, an off voltage $V_{off}$ is provided to other word lines WL2~WLm, the forming pulse is provided to the bit line BL1, and the ground voltage GND is provided to the source line SL1. For example, the off voltage $V_{off}$ is between −0.3V~−0.1V. In the resistive random-access memory cell c1, the word line WL1 receives the on voltage $V_{on}$. Consequently, the select transistor $M_1$ is turned on, and the forming voltage $V_{form}$ is applied to the two terminals of the resistive element $R_1$. In addition, a conducting filament is formed between the two terminals of the resistive element $R_1$. In the resistive random-access memory cells c2~cm, the word lines WL2~WLm receive the off voltage $V_{off}$. Since the two terminals of each of the resistive elements $R_2$~$R_m$ do not receive the forming voltage $V_{form}$, the conducting filament is not formed between the two terminals of each of the resistive elements $R_2$~$R_m$.

Then, a forming action is performed on the resistive random-access memory cell c2. As shown in FIG. 4B, the on voltage $V_{on}$ is provided to the word line WL2, the off voltage $V_{off}$ is provided to other word lines WL1 and WL3~WLm, the forming pulse is provided to the bit line BL1, and the ground voltage GND is provided to the source SL1. In the resistive random-access memory cell c2, the word line WL2 receives the on voltage $V_{on}$. Consequently, the select transistor $M_2$ is turned on, and the forming voltage $V_{form}$ is applied to the two terminals of the resistive element $R_2$. In addition, a conducting filament is formed between the two terminals of the resistive element $R_2$. In the resistive random-access memory cells c3~cm, the conducting filament is not formed between the two terminals of each of the resistive elements $R_3$~$R_m$.

The rest may be deduced by analog. The on voltage $V_{on}$ is provided to the other word lines sequentially. Afterwards, a forming action is performed on the resistive random-access memory cell cm. As shown in FIG. 4C, the on voltage $V_{on}$ is provided to the word line WLm, the off voltage $V_{off}$ is provided to other word lines, the forming pulse is provided to the bit line BL1, and the ground voltage GND is provided to the source SL1. Consequently, the select transistor $M_m$ is turned on, and the forming voltage $V_{form}$ is applied to the two terminals of the resistive element $R_m$. In addition, a conducting filament is formed between the two terminals of the resistive element $R_m$.

After the on voltage $V_{on}$ is provided to the word lines WL1~WLm sequentially, the forming actions on the m resistive random-access memory cells of the m×1 resistive random-access memory cell array are performed sequentially.

Ideally, if the value m of the m×1 resistive random-access memory cell array is very small (e.g., m=20), the forming action of the m×1 resistive random-access memory cell array can be successfully done. However, if the number of the word lines in the m×1 resistive random-access memory cell array is very huge (e.g., m=1024), the forming action using the above forming control method possibly fails when the load of the bit line BL1 and the leakage current of the resistive random-access memory cell are taken into consideration. The reasons will be described as follows.

FIGS. 5A, 5B and 5C are schematic circuit diagrams illustrating another conventional forming control method for the resistive random-access memory cell array. The resistive random-access memory cell array comprises 1024×1 resistive random-access memory cells c1~c1024. That is, the resistive random-access memory cell array comprises 1024 comprise 1024 word lines WL1~WL1024.

When the forming control method is performed, a ground voltage GND (i.e., 0V) is provided to the source line SL1, a forming pulse is provided to the bit line BL1, and an on voltage $V_{on}$ is provided to the word lines WL1~WL1024 sequentially. When the on voltage $V_{on}$ is provided to one of the word lines WL1~WLm, an off voltage $V_{off}$ is provided to the other word lines. Consequently, the forming actions on the resistive random-access memory cells c1~c1024 are performed sequentially. For example, the on voltage $V_{on}$ is equal to 2.5V, and the off voltage $V_{off}$ is between −0.3V~−0.1V.

Firstly, a forming action is performed on the resistive random-access memory cell c1. As shown in FIG. 5A, the on voltage $V_{on}$ is provided to the word line WL1, the off voltage $V_{off}$ is provided to other word lines WL2~WL1024, the forming pulse is provided to the bit line BL1, and the ground voltage GND is provided to the source line SL1. In the resistive random-access memory cell c1, the word line WL1 receives the on voltage $V_{on}$. Consequently, the select transistor $M_1$ is turned on. Meanwhile, the bit line BL1 receives the forming pulse with a pulse height of 2.8V. In other words, the bit line voltage $V_{BL1}$ is equal to 2.8V. Consequently, a conducting filament is formed between the two terminals of the resistive element $R_1$. In other words, the forming action on the resistive random-access memory cell c1 is successfully done.

Then, a forming action is performed on the resistive random-access memory cell c2. As shown in FIG. 5B, the on voltage $V_{on}$ is provided to the word line WL2, and the off voltage $V_{off}$ is provided to other word lines WL1 and WL3~WL1024. Meanwhile, the select transistor $M_1$ of the resistive random-access memory cell c1 receives the off voltage $V_{off}$. Since the resistive element $R_1$ has been changed to the set state corresponding to the low resistance value, the select transistor $M_1$ generates a leakage current $I_{leak1}$. The leakage current $I_{leak1}$ flows from the bit line BL1 to the source line SL1. Due to the generation of the leakage current and the load influence of the bit line BL1, the pulse height of the forming pulse decreases.

Please refer to FIG. 5B. When the forming pulse is provided to the bit line BL1, the pulse height of the forming pulse decreases to 2.795V. Consequently, the bit line voltage $V_{BL1}$ decreases to 2.795V. Although the bit line voltage $V_{BL1}$ is 2.795V, a conducting filament is formed between the two terminals of the resistive element $R_2$ of the resistive random-access memory cell c2. In other words, the forming action on the resistive random-access memory cell c2 is successfully done.

Then, a forming action is performed on the resistive random-access memory cell c3. Similarly, the on voltage $V_{on}$ is provided to the word line WL3, and the off voltage $V_{off}$ is provided to other word lines. Meanwhile, both of the resistive random-access memory cells c1 and c2 generate the leakage currents. Consequently, the bit line voltage $V_{BL1}$ decreases to the value lower than 2.795V. However, the forming action on the resistive random-access memory cell c3 is still successfully done.

As the number of the resistive random-access memory cells that have successfully undergone the forming action gradually increases, the leakage current on the source line SL1 increases and the bit line voltage $V_{BL1}$ decreases to a very small value. Please refer to FIG. 5C. Then, a forming action is performed on the resistive random-access memory cell c21. Similarly, the on voltage $V_{on}$ is provided to the word line WL21, and the off voltage $V_{off}$ is provided to other word lines. Since the forming actions on the resistive random-access memory cells c1~c20 of the resistive random-access memory cell array have been successfully done, all of the resistive random-access memory cells c1~c20 generate the leakage currents. The magnitude of the total leakage current $I_{leak}$ on the source line SL1 may be expressed as:

$$I_{leak} = \sum_{i=1}^{20} I_{leaki}.$$

Under this circumstance, the bit line voltage $V_{BL1}$ provided to the resistive random-access memory cell c21 is about 2.7V. Since the bit line voltage $V_{BL1}$ is too low, the conducting filament cannot be formed between the two terminals of the resistive element $R_{21}$ of the resistive random-access memory cell c21. In other words, forming action on the resistive random-access memory cell c21 is unsuccessfully done. Similarly, the forming actions on the resistive random-access memory cells c22~c1024 posterior to the resistive random-access memory cell c21 cannot be successfully done.

SUMMARY OF THE INVENTION

An embodiment of the present invention provides a forming control method for a resistive random-access memory cell array. The resistive random-access memory cell array includes m resistive random-access memory cells, wherein m is a positive integer. The forming control method includes the following steps. Firstly, in a step (a), set i as 1. In a step (b), an initial value of a forming voltage is provided. In a step (c), a forming pulse is generated according to the forming voltage, and a forming action is performed on an i-th resistive random-access memory cell of the resistive random-access memory cell array according to the forming pulse. In a step (d), a verification action is performed on the i-th resistive random-access memory cell to judge whether the i-th resistive random-access memory cell passes the verification action. In a step (e), if the i-th resistive random-access memory cell does not pass the verification action and a change number of the forming voltage provided to the i-th resistive random-access memory cell does not reach a preset value, the forming voltage is increased and the step (c) is performed again. In a step (f), if the i-th resistive random-access memory cell does not pass the verification action and the change number of the forming voltage provided to the i-th resistive random-access memory cell reaches the preset value, i is increased by 1 and the step (c) is performed again. In a step (g), if the i-th resistive random-access memory cell passes the verification action and i is not equal to m, i is increased by 1 and the step (c) is performed again. In a step (h), if the i-th resistive random-access memory cell passes the verification action and i is equal to m, the forming control method is ended.

Another embodiment of the present invention provides a forming control method for a resistive random-access memory cell array. Firstly, in a step (a), an initial value of a forming voltage is provided. In a step (b), an initial value of a pulse width is provided. In a step (c), a forming pulse according to the forming voltage and the pulse width, and a forming action is performed on plural resistive random-access memory cells in a selected row of the resistive random-access memory cell array according to the forming pulse. Then, a step (d) is performed to judge whether all of the plural resistive random-access memory cells in the selected row pass a verification action. In a step (e), if all of the plural resistive random-access memory cells in the selected row pass the verification action, a next selected row is determined, and the step (b) is performed again. In a step (f), if not all of the plural resistive random-access memory cells in the selected row pass the verification action and a change number of the pulse width does not reach a first preset value, the pulse width is increased, and the step (c) is performed again. In a step (g), if not all of the plural resistive random-access memory cells in the selected row pass the verification action, the change number of the pulse width reaches the first preset value and a change number of the forming voltage does not reach a second preset value, the forming voltage is increased, and the step (b) is performed again. In a step (h), if not all of the plural resistive random-access memory cells in the selected row pass the verification action, the change number of the pulse width reaches the first preset value and the change number of the forming voltage reaches the second preset value, the next selected row is determined, and the step (b) is performed again.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 4A, 4B and 4C (prior art) are schematic circuit diagrams illustrating another conventional forming control method for the resistive random-access memory cell array;

DETAILED DESCRIPTION OF PREFERRED EMBODIMENTS

As mentioned above, the conventional forming control method for the resistive random-access memory cell array has some drawbacks. For example, as the number of the resistive random-access memory cells that have successfully undergone the forming action gradually increases, the leakage current on the source line gradually increases, and the bit line voltage gradually decreases. Consequently, the subsequent forming actions on the other resistive random-access memory cells are adversely affected.

For solving the drawbacks of the conventional technologies, the present invention provides a novel forming control method for a resistive random-access memory cell array. In accordance with a feature of the present invention, the forming voltage $V_{form}$ or the pulse width w of the forming pulse is adjusted. Consequently, the forming actions on all of the resistive random-access memory cells of the resistive random-access memory cell array can be successfully done.

Figure 6A:
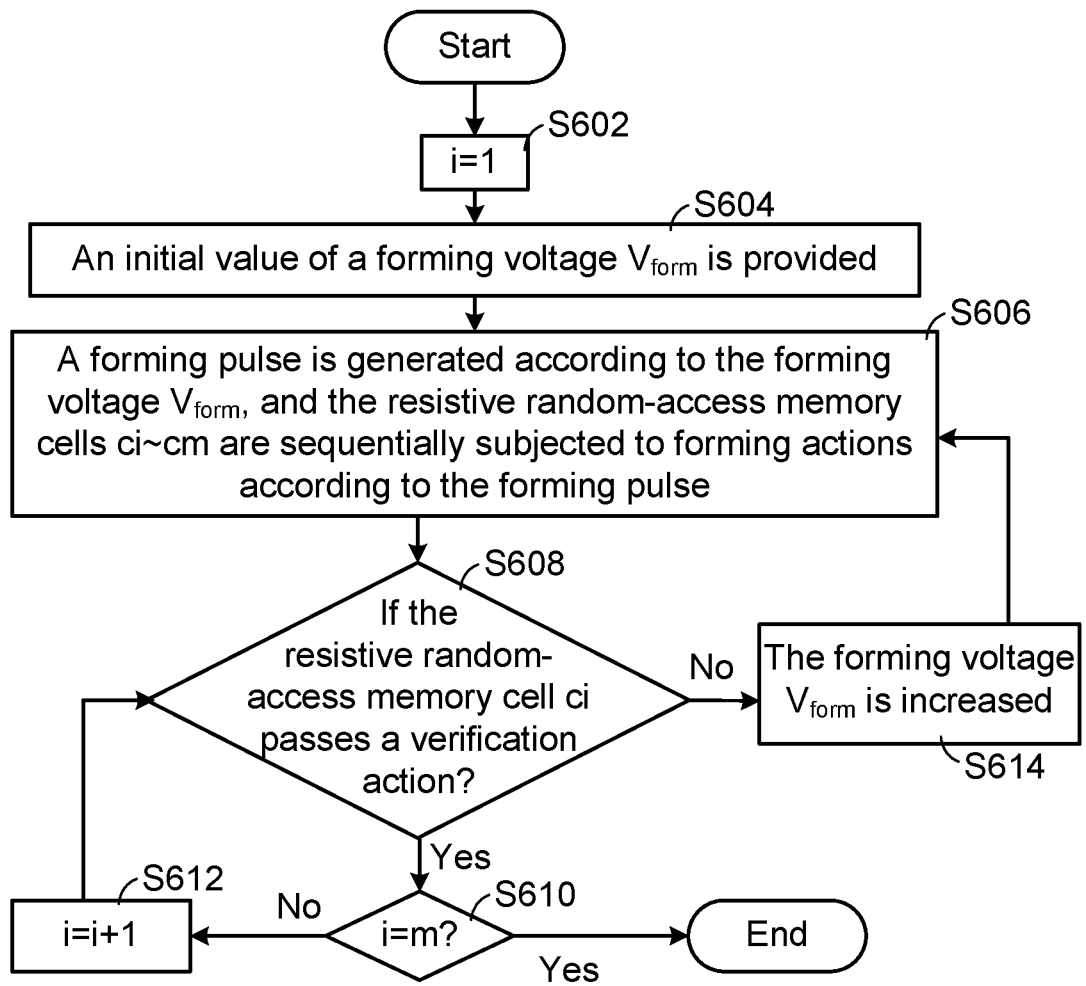
FIG. 6A is a flowchart of a forming control method for a resistive random-access memory cell array according to a first embodiment of the present invention.

FIG. 6A is a flowchart of a forming control method for a resistive random-access memory cell array according to a first embodiment of the present invention. After the forming control method is started, set i=1 (Step S602). Then, an initial value of a forming voltage $V_{form}$ is provided (Step S604). Then, a forming pulse is generated according to the forming voltage $V_{form}$, and the resistive random-access memory cells ci~cm are sequentially subjected to forming actions according to the forming pulse (Step S606).

Then, a step S608 is performed to judge whether the resistive random-access memory cell ci passes a verification action. If the resistive random-access memory cell ci passes the verification action, a step S610 is performed to judge whether the resistive random-access memory cell ci is the last resistive random-access memory cell (i.e., i is equal to m). If the judging condition of the step S610 is not satisfied, i=I+1 (Step S612) and the step S608 is repeatedly done. If the judging result of the step S608 indicates that the resistive random-access memory cell ci passes the verification action and the judging result of the step S610 indicates that the resistive random-access memory cell ci is the last resistive random-access memory cell (i.e., i=m), the flowchart is ended.

If the judging result of the step S608 indicates that the resistive random-access memory cell ci fails to pass the verification action, the forming voltage $V_{form}$ is increased (Step S614) and the step S606 is repeatedly done. For example, the initial forming voltage $V_{form}$ is increased by one increment voltage $\Delta V$. That is, $V_{form}=V_{form}+\Delta V$.

Figures 5A, 5B, 5C:
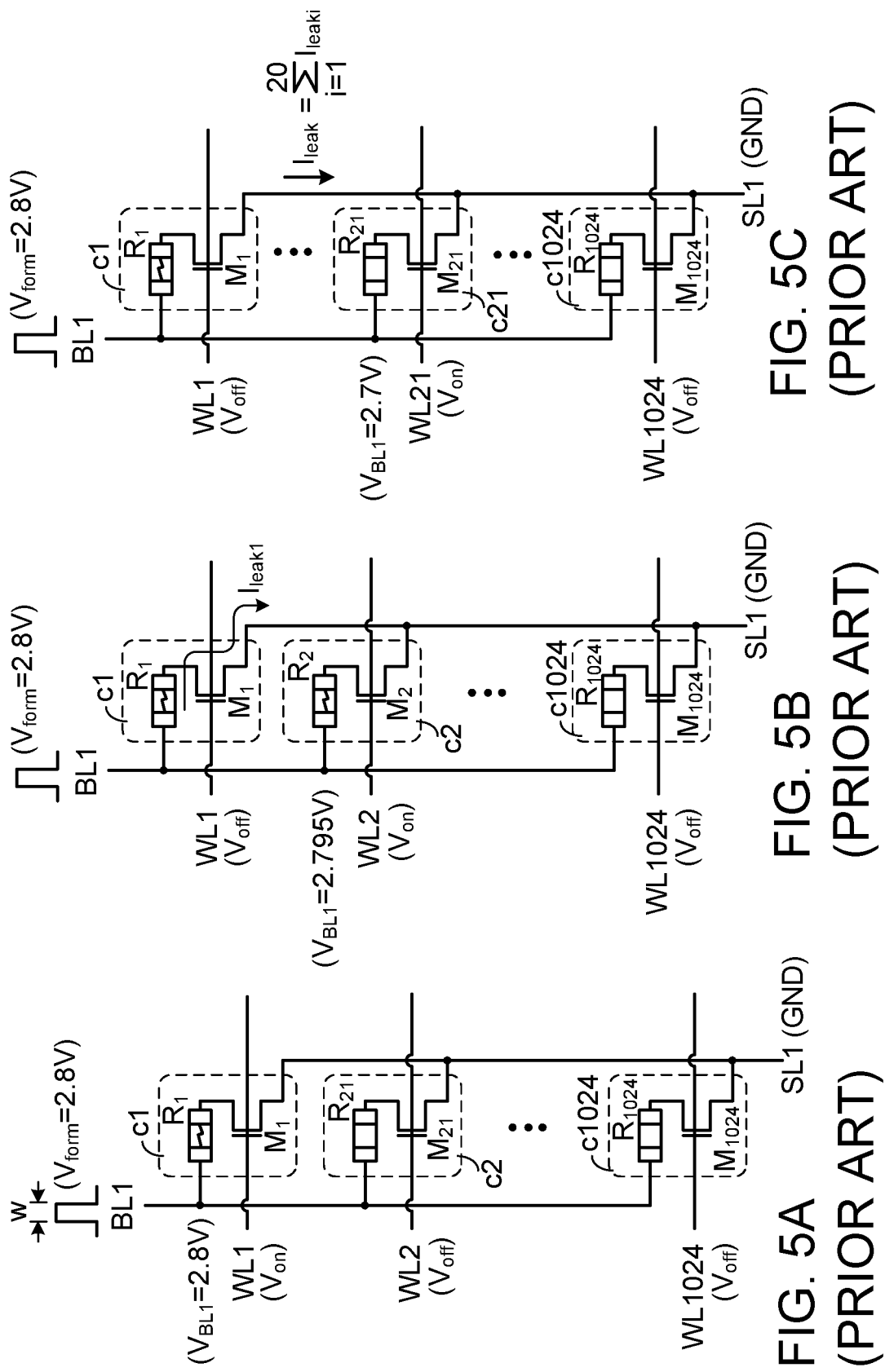
FIGS. 5A, 5B and 5C (prior art) are schematic circuit diagrams illustrating another conventional forming control method for the resistive random-access memory cell array.

For example, the forming control method of this embodiment can be applied to the resistive random-access memory cell array as shown in FIG. 5A. The resistive random-access memory cell array comprises m×1 resistive random-access memory cells c1~cm. For example, m is 1024. That is, the resistive random-access memory cell array comprises 1024 word lines WL1~WL1024.

Figure 6B:
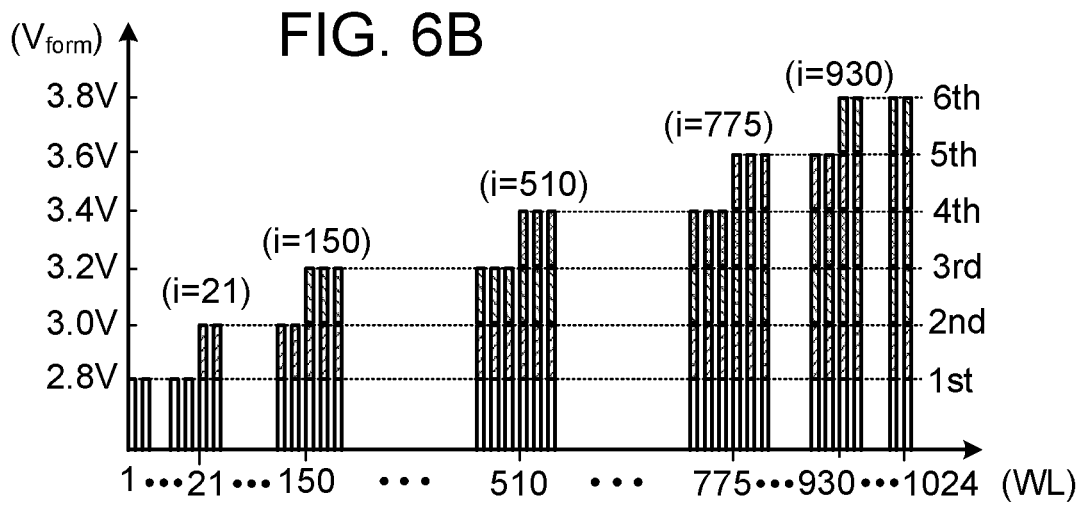
FIG. 6B is a statistical graph illustrating the relationships between the number of forming actions performed on the resistive memory cells of the resistive random-access memory cell array and the corresponding forming voltages by using the forming control method of FIG. 6A.

FIG. 6B is a statistical graph illustrating the relationships between the number of forming actions performed on the resistive memory cells of the resistive random-access memory cell array and the corresponding forming voltages by using the forming control method of FIG. 6A. For example, the initial value of a forming voltage $V_{form}$ is 2.8V, and the increment voltage $\Delta V$ is 0.2V.

After the forming control method of the first embodiment is started, the value i is equal to 1 and the initial value of the forming voltage $V_{form}$ is 2.8V (see the statistical graph of FIG. 6B). The on voltage $V_{on}$ is provided to the word lines WL1~WL1024 sequentially. Consequently, the resistive random-access memory cells c1~c1024 are subjected to a first forming action (1st).

Meanwhile, the value i is equal to 1. After the resistive random-access memory cells c1~c1024 are subjected to the first forming action, the verification action is performed on the resistive random-access memory cell c1. Since the resistive random-access memory cell c1 passes the verification action, i is added by 1 (i.e., i=2). Then, the verification action is performed on the resistive random-access memory cell c2. The rest may be deduced by analog. That is, the verification action is performed on the following resistive random-access memory cells sequentially.

Please refer to FIG. 6B again. When i is equal to 21, the resistive random-access memory cell c21 fails to pass the verification action. Then, the forming voltage $V_{form}$ is increased to 3.0V (i.e., 2.8V+0.2V=3.0V). The forming pulse is generated according to the forming voltage $V_{form}$ of 3.0V. The on voltage $V_{on}$ is provided to the word lines WL21~WL1024 sequentially. Consequently, the resistive random-access memory cells c21~c1024 are subjected to a second forming action (2nd).

Meanwhile, the value i is equal to 21. After the resistive random-access memory cells c21~c1024 are subjected to the second forming action, the verification action is performed on the resistive random-access memory cell c21. In addition, the verification action is performed on the following resistive random-access memory cells sequentially.

Please refer to FIG. 6B again. When i is equal to 150, the resistive random-access memory cell c150 fails to pass the verification action. Then, the forming voltage $V_{form}$ is increased to 3.2V (i.e., 3.0V+0.2V=3.2V). The forming pulse is generated according to the forming voltage $V_{form}$ of 3.2V. The on voltage $V_{on}$ is provided to the word lines WL150~WL1024 sequentially. Consequently, the resistive random-access memory cells c150~c1024 are subjected to a third forming action (3rd).

Meanwhile, the value i is equal to 150. After the resistive random-access memory cells c150~c1024 are subjected to the second forming action, the verification action is performed on the resistive random-access memory cell c150. In addition, the verification action is performed on the following resistive random-access memory cells sequentially.

Similarly, when i is equal to 510, the resistive random-access memory cell c510 fails to pass the verification action. Consequently, the forming voltage $V_{form}$ is increased to 3.4V, and the resistive random-access memory cells c510~c1024 are subjected to a fourth forming action (4th). Similarly, when i is equal to 775, the resistive random-access memory cell c775 fails to pass the verification action. Consequently, the forming voltage $V_{form}$ is increased to 3.6V, and the resistive random-access memory cells c775~c1024 are subjected to a fifth forming action (5th).

Afterwards, the forming voltage $V_{form}$ is increased to 3.8V. The forming pulse is generated according to the forming voltage $V_{form}$ of 3.8V. Consequently, the resistive random-access memory cells c930~c1024 are subjected to a sixth forming action (6th). Then, all of the resistive random-access memory cells c930~c1024 pass the verification action.

After the flowchart of the above forming control method is completed, it is confirmed that all of the resistive random-access memory cells c1~c1024 pass the verification action successfully. Then, the flowchart of the forming control method is ended.

However, the forming control method of the first embodiment still has some drawbacks. For example, since many resistive random-access memory cells are subjected to the forming actions for many times, the forming control method is time-consuming. For example, the resistive random-access memory cells c930~c1024 need to undergo the forming actions for six times. In other words, the forming control method of the first embodiment needs to be modified.

Figure 7A:
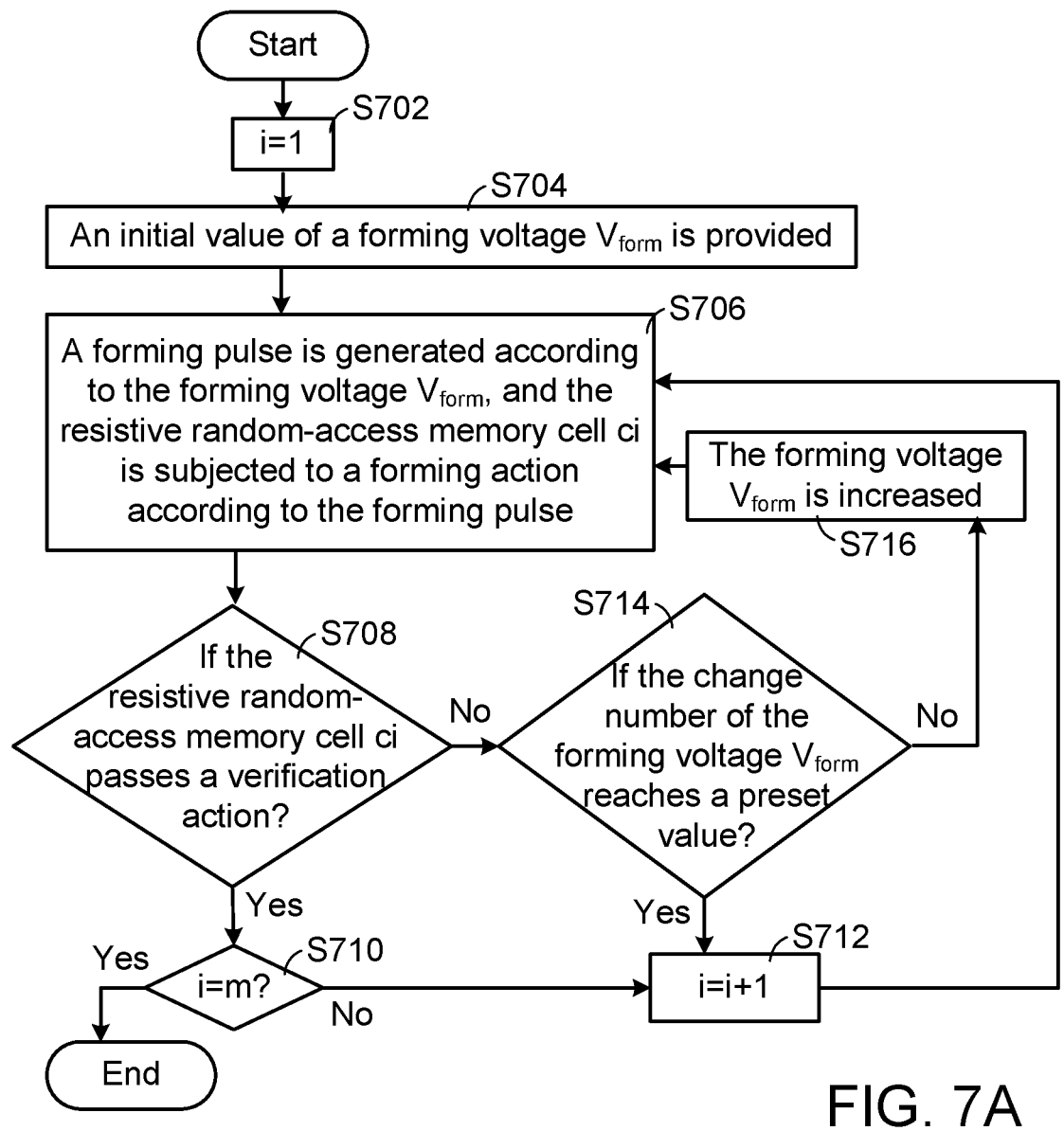
FIG. 7A is a flowchart of a forming control method for a resistive random-access memory cell array according to a second embodiment of the present invention.

FIG. 7A is a flowchart of a forming control method for a resistive random-access memory cell array according to a second embodiment of the present invention. After the forming control method is started, set i=1 (Step S702). Then, an initial value of a forming voltage $V_{form}$ is provided (Step S704). Then, a forming pulse is generated according to the forming voltage $V_{form}$, and the resistive random-access memory cell ci is subjected to a forming action according to the forming pulse (Step S706).

Then, a step S708 is performed to judge whether the resistive random-access memory cell ci passes a verification action. If the resistive random-access memory cell ci passes the verification action, a step S710 is performed to judge whether the resistive random-access memory cell ci is the last resistive random-access memory cell (i.e., i is equal to m). If the judging condition of the step S710 is not satisfied, i=i+1 (Step S712) and the step S706 is repeatedly done. If the judging result of the step S708 indicates that the resistive random-access memory cell ci passes the verification action and the judging result of the step S710 indicates that the resistive random-access memory cell ci is the last resistive random-access memory cell (i.e., i=m), the flowchart is ended.

If the judging result of the step S708 indicates that the resistive random-access memory cell ci fails to pass the verification action, a step S714 is performed to judge whether the change number of the forming voltage $V_{form}$ reaches a preset value. If the judging condition of the step S714 is not satisfied, the forming voltage $V_{form}$ is increased (Step S716) and the step S706 is repeatedly done. For example, the initial forming voltage $V_{form}$ is increased by one increment voltage $\Delta V$. That is, $V_{form}=V_{form}+\Delta V$. If the judging condition of the step S714 is satisfied, it is confirmed that the resistive random-access memory cell ci is a bad cell, and the step S712 is performed.

For example, the forming control method of this embodiment can be applied to the resistive random-access memory cell array as shown in FIG. 5A. The resistive random-access memory cell array comprises m×1 resistive random-access memory cells c1~cm. For example, m is 1024. That is, the resistive random-access memory cell array comprises 1024 word lines WL1~WL1024.

Figure 7B:
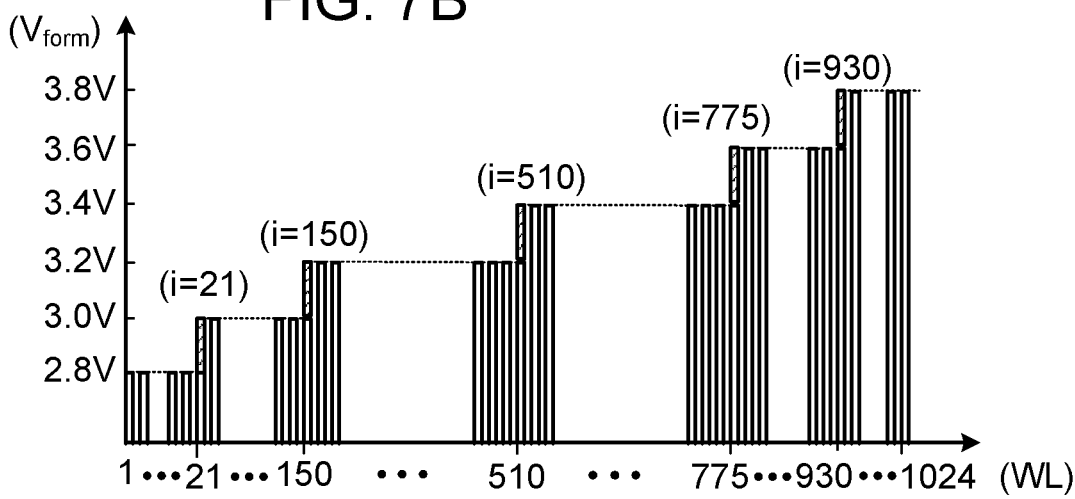
FIG. 7B is a statistical graph illustrating the relationships between the number of forming actions performed on the resistive memory cells of the resistive random-access memory cell array and the corresponding forming voltages by using the forming control method of FIG. 7A.

FIG. 7B is a statistical graph illustrating the relationships between the number of forming actions performed on the resistive memory cells of the resistive random-access memory cell array and the corresponding forming voltages by using the forming control method of FIG. 7A. For example, the initial value of a forming voltage $V_{form}$ is 2.8V, and the increment voltage $\Delta V$ is 0.2V. In an embodiment, the preset value corresponding to the change number of the forming voltage $V_{form}$ is 1.

After the forming control method of the first embodiment is started, the value i is equal to 1 and the initial value of the forming voltage $V_{form}$ is 2.8V (see the statistical graph of FIG. 7B). Then, the resistive random-access memory cell c1 is subjected to a forming action and a verification action according to the forming pulse with the pulse height of 2.8V. If the resistive random-access memory cell c1 passes the verification action, i is added by 1 (i.e., i=2). Then, the resistive random-access memory cell c2 is subjected to the forming action and the verification action according to the forming pulse with the pulse height of 2.8V. The rest may be deduced by analog.

Please refer to FIG. 7B again. When i is equal to 21, the resistive random-access memory cell c21 is subjected to the forming action according to the forming pulse with the pulse height of 2.8V. However, the resistive random-access memory cell c21 fails to pass the verification action. Since the forming voltage $V_{form}$ provided to the resistive random-access memory cell c21 does not reach the preset value corresponding to the change number of the forming voltage $V_{form}$ (i.e., 1), the forming voltage $V_{form}$ is increased to 3.0V (i.e., 2.8V+0.2V=3.0V). The forming pulse is generated according to the forming voltage $V_{form}$ of 3.0V. Then, the resistive random-access memory cell c21 is subjected to a forming action and a verification action according to the forming pulse with the pulse height of 3.0V. If the resistive random-access memory cell c21 passes the verification action, i is added by 1 (i.e., i=22). Then, the resistive random-access memory cell c22 is subjected to the forming action and the verification action according to the forming pulse with the pulse height of 3.0V. The rest may be deduced by analog.

Please refer to FIG. 7B again. When i is equal to 150, the resistive random-access memory cell c150 is subjected to the forming action according to the forming pulse with the pulse height of 3.0V. However, the resistive random-access memory cell c150 fails to pass the verification action. Since the forming voltage $V_{form}$ provided to the resistive random-access memory cell c150 does not reach the preset value corresponding to the change number of the forming voltage $V_{form}$ (i.e., 1), the forming voltage $V_{form}$ is increased to 3.2V (i.e., 3.0V+0.2V=3.2V). The forming pulse is generated according to the forming voltage $V_{form}$ of 3.2V. Then, the resistive random-access memory cell c150 is subjected to a forming action and a verification action according to the forming pulse with the pulse height of 3.2V. If the resistive random-access memory cell c150 passes the verification action, i is added by 1 (i.e., i=151). Then, the resistive random-access memory cell c151 is subjected to the forming action and the verification action according to the forming pulse with the pulse height of 3.2V. The rest may be deduced by analog. Similarly, when i is equal to 510, the resistive random-access memory cell c510 fails to pass the verification action. Consequently, the forming voltage $V_{form}$ is increased to 3.4V. Similarly, when i is equal to 775, the resistive random-access memory cell c775 fails to pass the verification action. Consequently, the forming voltage $V_{form}$ is increased to 3.6V.

Afterwards, the forming voltage $V_{form}$ is increased to 3.8V. The forming pulse is generated according to the forming voltage $V_{form}$ of 3.8V. After the resistive random-access memory cells c930~c1024 are subjected to the forming action and the verification action, it is confirmed that the resistive random-access memory cells c930~c1024 pass the verification actions.

After the flowchart of the above forming control method is completed, it is confirmed that all of the resistive random-access memory cells c1~c1024 pass the verification action successfully. Then, the flowchart of the forming control method is ended.

As mentioned above descriptions, the forming control method of the second embodiment is advantageous over the forming control method of the first embodiment. For example, since the number of forming actions that the resistive random-access memory cells are subjected to the forming actions is reduced, the time period of implementing the forming control method of the second embodiment is largely reduced. It is noted that the preset value corresponding to the change number of the forming voltage $V_{form}$ is not restricted. For example, if the preset value is 2, each resistive random-access memory cell is subjected to the forming action for at most three times.

As mentioned above, the forming control method of the first embodiment and the forming control method of the second embodiment can be applied to the m×1 resistive random-access memory cell array to perform the forming actions on a column of resistive random-access memory cells.

The forming control method of the present invention can be also applied to the 1×n resistive random-access memory cell array. Under this circumstance, the number "m" in the step S710 is replaced by the number "n". After the word line WL1 receives the on voltage $V_{on}$, a forming pulse is provided to the bit lines BL1~BLn sequentially. Consequently, a row of resistive random-access memory cells can be subjected to the forming actions.

Similarly, the forming control method of the first embodiment and the forming control method of the second embodiment can be applied to the m×n resistive random-access memory cell array. After m resistive random-access memory cells in a first column are subjected to the forming actions, the m resistive random-access memory cells in a second column are subjected to the forming actions. The rest may be deduced by analog. After the m resistive random-access memory cells in the n-th column are subjected to the forming actions, the forming control method is completed. Alternatively, after n resistive random-access memory cells in a first row are subjected to the forming actions, the n resistive random-access memory cells in a second row are subjected to the forming actions. The rest may be deduced by analog. After the n resistive random-access memory cells in the m-th column are subjected to the forming actions, the forming control method is completed.

In the first embodiment and the second embodiment, the pulse height of the forming pulse is according to the forming voltage $V_{form}$. That is, the pulse width w is not changed. In some other embodiments, the pulse width is changeable.

Figure 1:
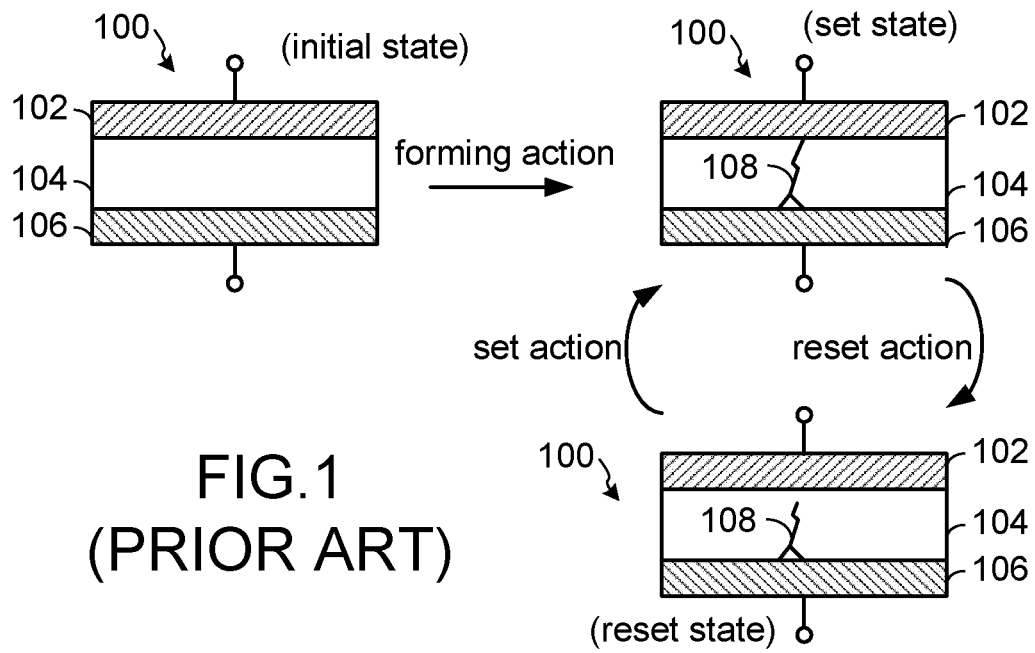
FIG. 1 (prior art) schematically illustrates the structure of a conventional resistive element.
Figure 2:
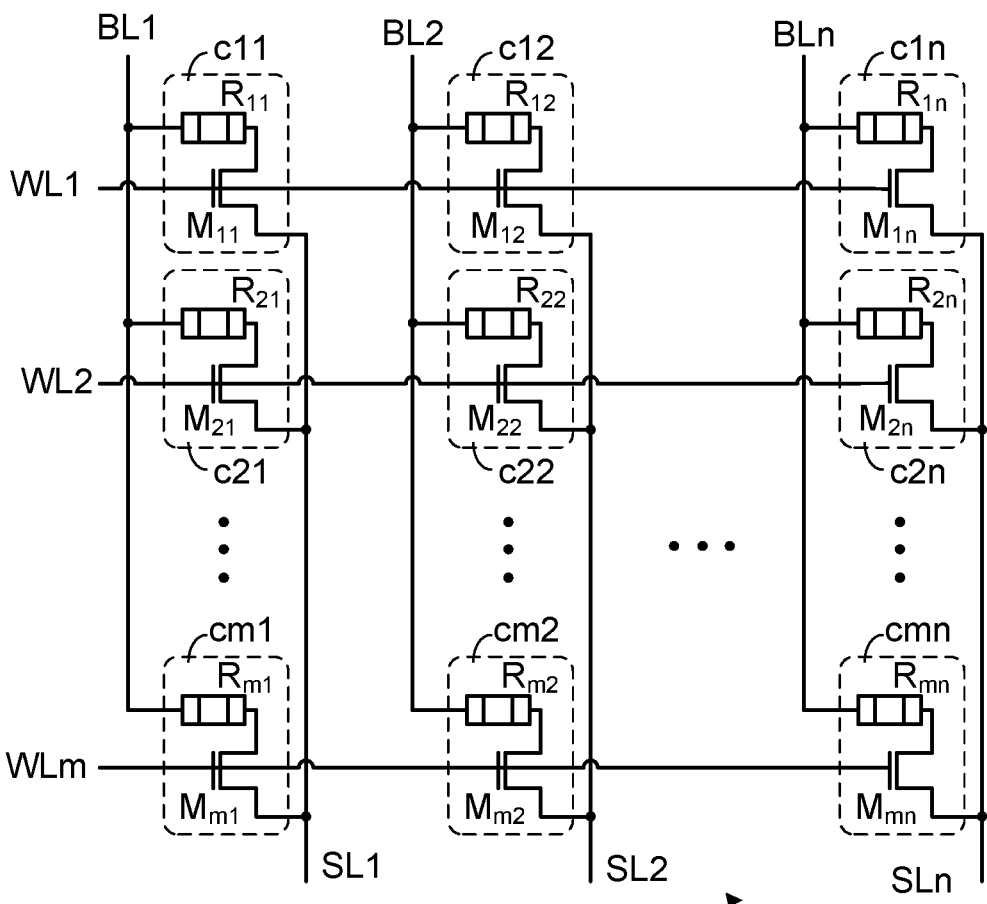
FIG. 2 (prior art) is a schematic equivalent circuit diagram illustrating a resistive random-access memory cell array.
Figure 3A:
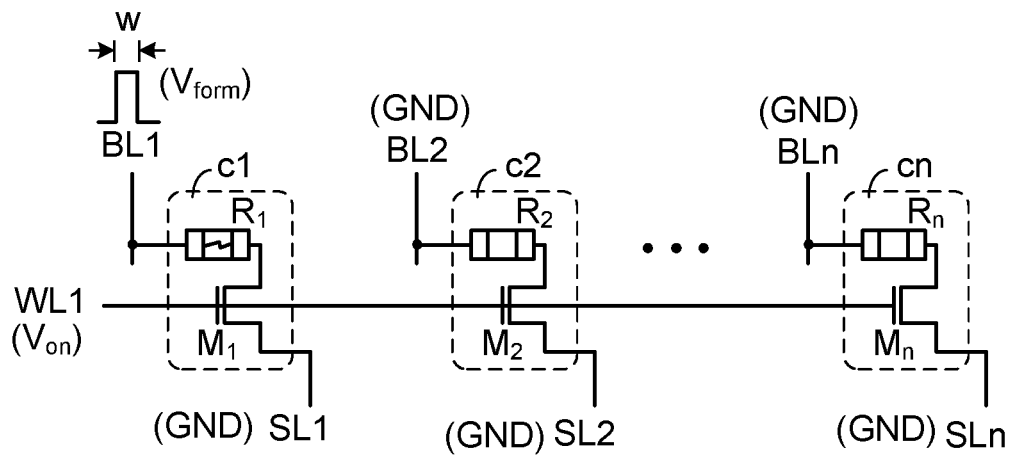
FIGS. 3A, 3B and 3C (prior art) are schematic circuit diagrams illustrating a conventional forming control method for the resistive random-access memory cell array.
Figure 3B:
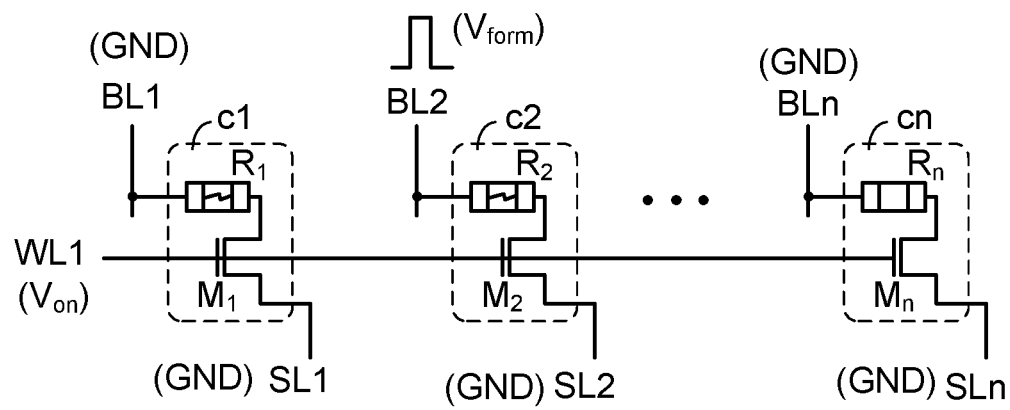
Figure 3C:
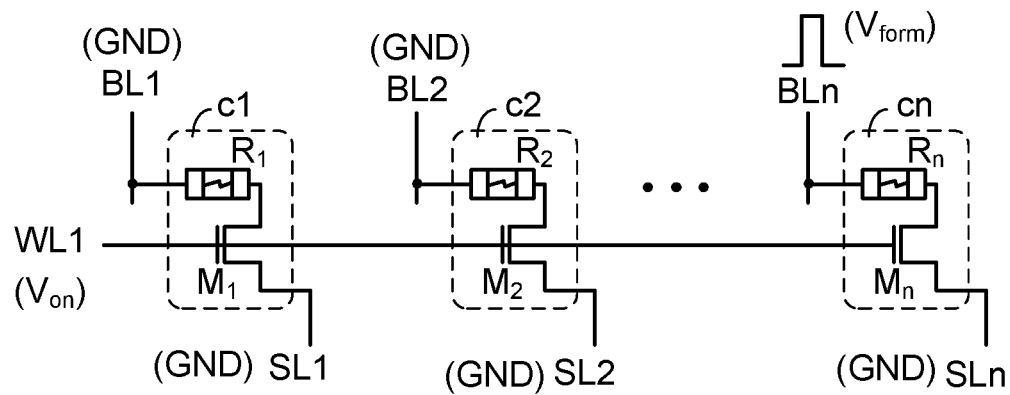
Figure 8A:
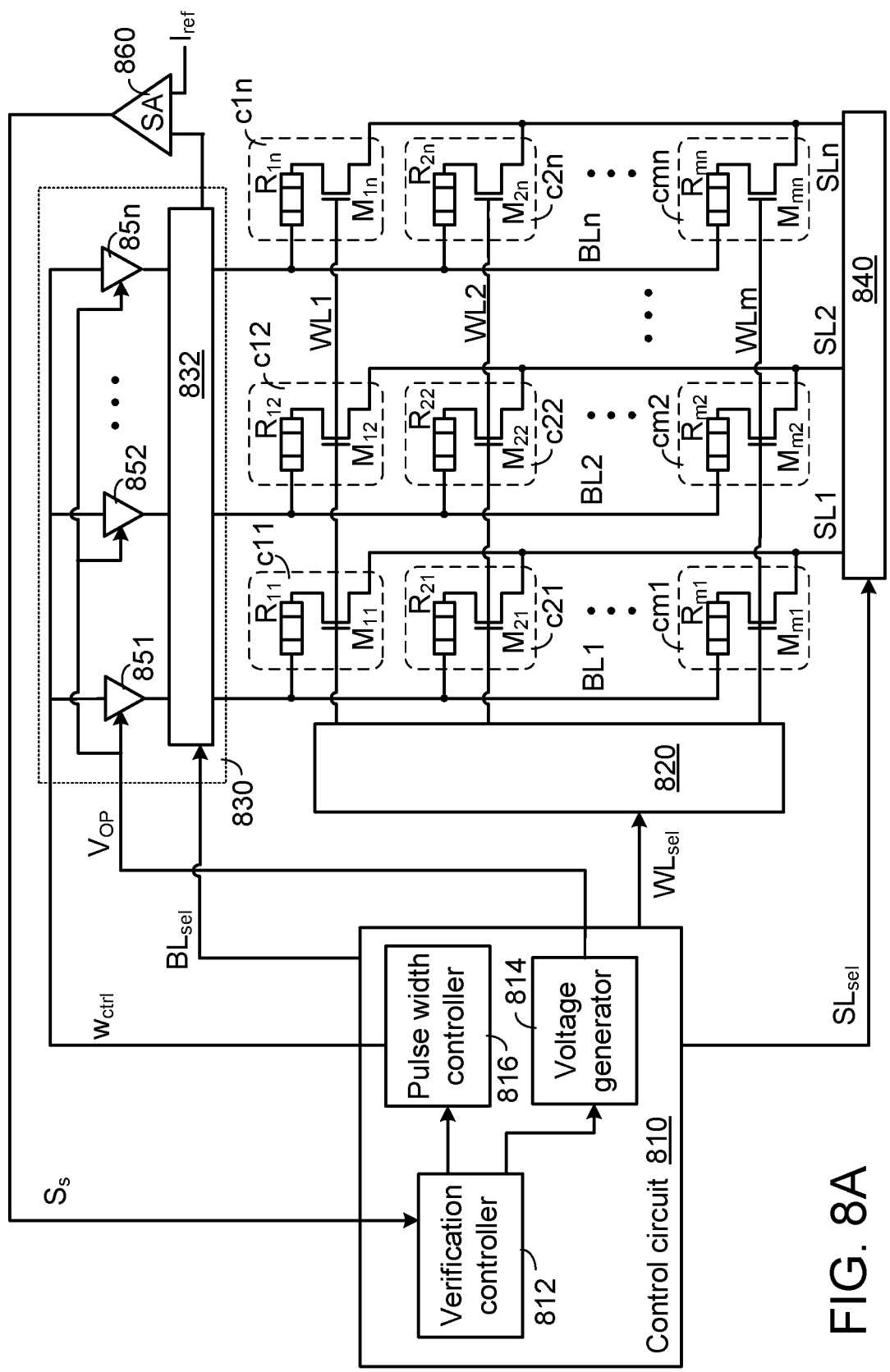
FIG. 8A is a schematic circuit diagram illustrating a resistive random-access memory according to an embodiment of the present invention.

FIG. 8A is a schematic circuit diagram illustrating a resistive random-access memory according to an embodiment of the present invention. As shown in FIG. 8A, the resistive random-access memory comprises a control circuit 810, a resistive random-access memory cell array, a sense amplifier (SA) 860, a word line selector 820, a bit line selector 830 and a source line selector 840. The resistive random-access memory cell array is an m×n resistive random-access memory cell array, wherein m and n are positive integers. For example, m is equal to 1024, and n is equal to 2048. The structure of the resistive random-access memory cell array is identical to that of FIG. 2, and not redundantly described herein.

The control circuit 810 generates the word line select signal $WL_{sel}$, the bit line select signal $BL_{sel}$ and the source line select signal $SL_{sel}$ to determine the selected memory cell of the resistive random-access memory cell array. Moreover, the control circuit 810 can perform the forming action, the set action, the reset action, read action and the verification action on the selected memory cell.

In an embodiment, the control circuit 810 comprises a pulse width controller 816 and a voltage generator 814. For example, when the forming action is performed, the operation voltage $V_{OP}$ generated by the voltage generator 814 is the forming voltage $V_{form}$ and the pulse width controller 816 generates the pulse width control signal $W_{ctrl}$. Consequently, the forming action on the selected memory cell is performed. Similarly, when the set action is performed, the operation voltage $V_{OP}$ generated by the voltage generator 814 is the set voltage, and the selected memory cell undergoes the set action. When the reset action is performed, the operation voltage $V_{OP}$ generated by the voltage generator 814 is the reset voltage, and the selected memory cell undergoes the reset action.

The control circuit 810 further comprises a verification controller 812 receives the storage state signal $S_s$ and judges whether the selected memory cell passes the verification action according to the storage state signal $S_s$. In addition, the verification controller 812 can control the voltage generator 814 to change the operation voltage $V_{OP}$ (i.e., forming voltage $V_{form}$) or control the pulse width controller 816 to change the pulse width control signal $W_{ctrl}$ during the forming action.

The word line selector 820 is connected to the word lines WL1~WLm. According to a word line select signal $WL_{sel}$, the word line selector 820 provides the on voltage $V_{on}$ to one of the word lines WL1~WLm and provides the off voltage $V_{off}$ to the other word lines. For example, according to the word line select signal $WL_{sel}$, the word line selector 820 provides the on voltage $V_{on}$ to the word line WL1 and provides the off voltage $V_{off}$ to the WL2~WLm. Under this circumstance, the word line WL1 is the selected word line and the first row of the resistive random-access memory cell array connected to the word line WL1 is the selected row.

The bit line selector 830 is connected to the bit lines BL1~BLn. According to a bit line select signal $BL_{sel}$, a pulse width control signal $W_{ctrl}$ and the operation voltage $V_{OP}$, the bit line selector 830 is capable of provides the forming pulse, the set voltage or the reset voltage to the selected bit line. In an embodiment, the bit line selector 830 comprises a switching circuit 832 and plural drivers 851~85n. The plural drivers 851~85n receive the pulse width control signal $W_{ctrl}$ and the operation voltage $V_{OP}$. In addition, the switching circuit 832 are connected between the plural drivers 851~85n and the bit lines BL1~BLn. According to the bit line select signal $BL_{sel}$, the switching circuit 832 determines one of the plural drivers 851~85n as the selected driver and determines the corresponding bit line as the selected bit line. Furthermore, the selected driver is connected to the selected bit line by the switching circuit 832. According to the pulse width control signal $W_{ctrl}$ and the forming voltage $V_{form}$, the selected driver of the bit line selector 830 provides the forming pulse to the selected bit line during the forming action. Similarly, the bit line selector 830 provides the set voltage to the selected bit line during the set action. The bit line selector 830 provides the reset voltage to the selected bit line during the reset action.

The source line selector 840 is connected to the source lines SL1~SLn. According to a source line select signal $SL_{sel}$, the source line selector 840 determines one of the source line SL1~SLn as the selected source line and the selected source line is connected to the ground voltage GND during the forming action, the set action and the reset action. That is to say, the selected memory cell of the resistive random-access memory cell array is determined in response to the selected word line, the selected bit line and the selected source line.

Furthermore, during the read action or the verification, the source line selector 840 is capable of providing the read voltage to the selected source line. Also, the switching circuit 832 of the bit line selector 830 is capable of conducting the current on the selected bit line to the sense amplifier 860, and the sense amplifier 860 is capable of generating a storage state signal $S_s$ according to a reference current $I_{ref}$ and a current on the selected source line. Thus, the storage state of the selected memory cell is determined according to the storage state signal $S_s$.

Figure 8B:
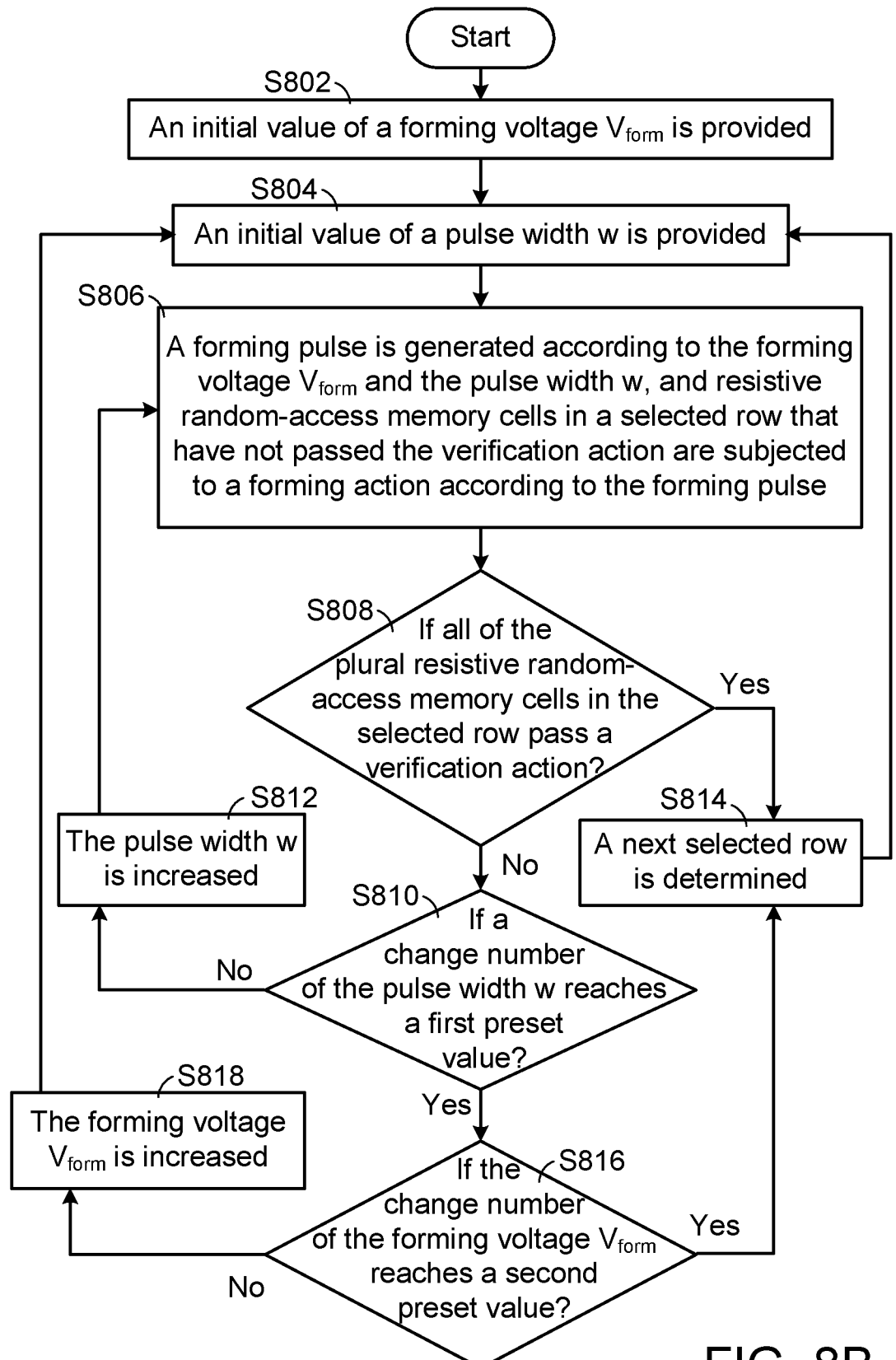
FIG. 8B is a flowchart of a forming control method for a resistive random-access memory cell array according a third embodiment of the present invention.

FIG. 8B is a flowchart of a forming control method for a resistive random-access memory cell array according a third embodiment of the present invention. After the forming control method is started, an initial value of a forming voltage $V_{form}$ is provided (Step S802) and an initial value of a pulse width w is provided (Step S804). Then, a forming pulse is generated according to the forming voltage $V_{form}$ and the pulse width w, and plural resistive random-access memory cells in a selected row that have not passed the verification action are subjected to a forming action according to the forming pulse (Step S806).

Then, a step S808 is performed to judge whether all of the plural resistive random-access memory cells in the selected row pass a verification action. According to the embodiment of the invention, the forming actions are firstly performed on the resistive random-access memory cells in the selected row. Then, the resistive random-access memory cells in the same selected row are followed by the verification actions after the forming actions.

That is, the step S808 is used to judge whether the resistive random-access memory cells subjected to the forming action in the step S806 pass the verification action. If all of the resistive random-access memory cells pass the verification action, it means that the forming action on all of the resistive random-access memory cells in the selected row has been successfully done. Then, a next selected row is determined (Step S814), and the step S804 is repeatedly done.

If some of the resistive random-access memory cells fail to pass the verification action, it means that the forming action on some of the resistive random-access memory cells in the selected row has not been successfully done. Then, a step S810 is performed to judge whether a change number of the pulse width w reaches a first preset value. If the judging condition of the step S810 is not satisfied, the pulse width w is increased (Step S812) and the step S806 is repeatedly done. For example, if the first preset value corresponding to the change number of the pulse width w is 2, there are three pulse widths. For example, the initial value of the pulse width is 100 ns. After a first change, the pulse width w is 500 ns. After a second change, the pulse width w is 1 μs. In other words, if the forming voltage $V_{form}$ is not change, the steps S806~S810 are performed for at most three times.

If the judging condition of the step S810 is satisfied, a step S816 is performed to judge whether the change number of the forming voltage $V_{form}$ reaches a second preset value. For example, the second preset value is 1. If the judging condition of the step S816 is not satisfied, the forming voltage $V_{form}$ is increased (Step S818) and the step S804 is repeatedly done. For example, the initial forming voltage $V_{form}$ is increased by one increment voltage $\Delta V$. That is, $V_{form} = V_{form} + \Delta V$.

If the change number of the forming voltage $V_{form}$ reaches the second preset value and some of the resistive random-access memory cells in the selected row are still not verified, the selected row is no longer subjected to the forming action and the next selected row is determined (Step S814). Optionally, before the step S814, an additional step is performed to judge whether the number of the resistive random-access memory cells in the selected row that fail to pass the verification action is smaller than a threshold value. If the judging condition is satisfied, it means that the forming action on the selected row has been successfully done. Whereas, if the judging condition is not satisfied, it is confirmed that the selected row is a failed row.

For example, the selected row contains 2048 resistive random-access memory cells, and the threshold value is 3. If the number of the resistive random-access memory cells in the selected row that fail to pass the verification action is smaller than 3, it is determined that the forming action on the selected row has been successfully done. Whereas, if the number of the resistive random-access memory cells in the selected row that fail to pass the verification action is larger than or equal to 3, the selected row is determined as a failed row and discarded. The discarded row will not be used to store data.

Moreover, the step of determining the next selected row (i.e., the step S814) is continuously performed until the forming action on the resistive random-access memory cells in the last selected row of the resistive random-access memory cell array is completed. Meanwhile, the forming control method is ended. In some embodiments, if not all of the plural resistive random-access memory cells in the selected row pass the verification action, the step 806 is performed after the steps 812 and 818, and the forming action in the step 806 can be performed on the resistive random-access memory cells in the selected row that have not pass the verification action, and the random-access memory cells in the selected row that have pass the verification action can be inhibited, that is, the forming action is not performed on the inhibited random-access memory cells in the selected row which have pass the verification action.

From the above descriptions, the present invention provides a forming control method for a resistive random-access memory cell array. While the forming action of the resistive random-access memory cell array is performed, the verification action is performed to judge whether the forming action on the resistive random-access memory cells has been successfully done. By properly changing the forming voltage or the pulse width, the forming actions on all of the resistive random-access memory cells of the resistive random-access memory cell array can be successfully done.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A forming control method for a resistive random-access memory cell array, the resistive random-access memory cell array comprising m resistive random-access memory cells, m being a positive integer, the forming control method comprising steps of:
(a) setting i as 1;
(b) providing an initial value of a forming voltage;
(c) generating a forming pulse according to the forming voltage, and performing a forming action on an i-th resistive random-access memory cell of the resistive random-access memory cell array according to the forming pulse;
(d) performing a verification action on the i-th resistive random-access memory cell, and judging whether the i-th resistive random-access memory cell passes the verification action;
(e) if the i-th resistive random-access memory cell does not pass the verification action and a change number of the forming voltage provided to the i-th resistive random-access memory cell does not reach a preset value, increasing the forming voltage and performing the step (c) again;
(f) if the i-th resistive random-access memory cell does not pass the verification action and the change number of the forming voltage provided to the i-th resistive random-access memory cell reaches the preset value, increasing i by 1 and performing the step (c) again;
(g) if the i-th resistive random-access memory cell passes the verification action and i is not equal to m, increasing i by 1 and performing the step (c) again; and
(h) if the i-th resistive random-access memory cell passes the verification action and i is equal to m, ending the forming control method.

2. The forming control method as claimed in claim 1, wherein the forming pulse has a pulse width and a pulse height, wherein the pulse height is equal to a voltage level of the forming voltage.

3. The forming control method as claimed in claim 1, wherein the resistive random-access memory cell array is an m×1 resistive random-access memory cell array, and the i-th resistive random-access memory cell comprises:
a resistive element, wherein a first terminal of the resistive element is connected to a bit line; and
a select transistor, wherein a first drain/source terminal of the select transistor is connected to a second terminal of the resistive element, a second drain/source terminal of the select transistor is connected to a source line, and a gate terminal of the select transistor is connected to an i-th word line.

4. The forming control method as claimed in claim 3, wherein when the forming action is performed on the i-th resistive random-access memory cell, an on voltage is provided to the i-th word line, the forming pulse is provided to the bit line, and a ground voltage is provided to the source line.

5. The forming control method as claimed in claim 4, wherein when the verification action is performed on the i-th resistive random-access memory cell, the on voltage is provided to the i-th word line, a read voltage is provided to the i-th resistive random-access memory cell, wherein a control circuit judges whether the i-th resistive random-access memory cell passes the verification action according to a read current generated by the i-th resistive random-access memory cell.

6. The forming control method as claimed in claim 5, wherein if the read current is higher than a reference current, the control circuit judges that the i-th resistive random-access memory cell passes the verification action, wherein if the read current is lower than the reference current, the control circuit judges that the i-th resistive random-access memory cell does not pass the verification action.

7. The forming control method as claimed in claim 1, wherein if a judging condition of the step (f) is satisfied, it is determined that the i-th resistive random-access memory cell is a bad cell.

8. The forming control method as claimed in claim 1, wherein if a judging condition of the step (e) is satisfied, the forming voltage plus an increment voltage is updated as a new value of the forming voltage.

9. A forming control method for a resistive random-access memory cell array, the forming control method comprising steps of:
(a) providing an initial value of a forming voltage;
(b) providing an initial value of a pulse width;
(c) generating a forming pulse according to the forming voltage and the pulse width, and performing a forming action on plural resistive random-access memory cells in a selected row of the resistive random-access memory cell array according to the forming pulse
(d) judging whether all of the plural resistive random-access memory cells in the selected row pass a verification action;
(e) if all of the plural resistive random-access memory cells in the selected row pass the verification action, determining a next selected row and performing the step (b) again;
(f) if not all of the plural resistive random-access memory cells in the selected row pass the verification action and a change number of the pulse width does not reach a first preset value, increasing the pulse width and performing the step (c) again;
(g) if not all of the plural resistive random-access memory cells in the selected row pass the verification action, the change number of the pulse width reaches the first preset value and a change number of the forming voltage does not reach a second preset value, increasing the forming voltage and performing the step (b) again; and
(h) if not all of the plural resistive random-access memory cells in the selected row pass the verification action, the change number of the pulse width reaches the first preset value and the change number of the forming voltage reaches the second preset value, determining the next selected row and performing the step (b) again.

10. The forming control method as claimed in claim 9, wherein the step (c) further comprises: performing the forming action on the plural resistive random-access memory cells in the selected row according to the forming pulse, and the plural resistive random-access memory cells have not passed the verification action.

11. The forming control method as claimed in claim 9, wherein the forming pulse has a pulse height, and the pulse height is equal to a voltage level of the forming voltage.

12. The forming control method as claimed in claim 9, wherein the resistive random-access memory cell array being an m×n resistive random-access memory cell array, and the selected row contains n resistive random-access memory cells, wherein a first resistive random-access memory cell of the n resistive random-access memory cells comprises:

a resistive element, wherein a first terminal of the resistive element is connected to a first bit line; and a select transistor, wherein a first drain/source terminal of the select transistor is connected to a second terminal of the resistive element, a second drain/source terminal of the select transistor is connected to a first source line, and a gate terminal of the select transistor is connected to a first word line.

13. The forming control method as claimed in claim 12, wherein when the forming action is performed on the first resistive random-access memory cell, an on voltage is provided to the first word line, the forming pulse is provided to the first bit line, and a ground voltage is provided to the first source line.

14. The forming control method as claimed in claim 13, wherein when the verification action is performed on the first resistive random-access memory cell, the on voltage is provided to the first word line, a read voltage is provided to the first resistive random-access memory cell, wherein a control circuit judges whether the first resistive random-access memory cell passes the verification action according to a read current generated by the first resistive random-access memory cell.

15. The forming control method as claimed in claim 14, wherein if the read current is higher than a reference current, the control circuit judges that the first resistive random-access memory cell passes the verification action, wherein if the read current is lower than the reference current, the control circuit judges that the first resistive random-access memory cell does not pass the verification action.

16. The forming control method as claimed in claim 12, wherein the step of determining the next selected row is continuously performed until the forming action on the n resistive random-access memory cells in an m-th row of the resistive random-access memory cell array is completed, wherein after the forming action on the n resistive random-access memory cells in the m-th row of the resistive random-access memory cell array is completed, the forming control method is ended.

17. The forming control method as claimed in claim 12, wherein the step (h) further comprises sub-steps of:

(h1) if a number of the resistive random-access memory cells in the selected row failing to pass the verification action is smaller than a threshold value, determining the next selected row, and performing the step (b) again; and (h2) if the number of the resistive random-access memory cells in the selected row failing to pass the verification action is larger than or equal to the threshold value, confirming the selected row is a failed row, determining the next selected row, and performing the step (b) again.

18. The forming control method as claimed in claim 9, wherein if a judging condition of the step (g) is satisfied, the forming voltage plus an increment voltage is updated as a new value of the forming voltage.

19. The forming control method as claimed in claim 9, wherein after performing the steps (f) and (g), the step (c) further comprises: performing the forming action on the plural resistive random-access memory cells in the selected row that have not passed the verification action and inhibit the plural resistive random-access memory cells in the selected row that have passed the verification action.

* * * * *